United States Patent [19]
Dallabora et al.

[11] Patent Number: 5,258,959
[45] Date of Patent: Nov. 2, 1993

[54] MEMORY CELL READING CIRCUIT

[75] Inventors: Marco Dallabora; Corrado Villa, both of Milan, Italy

[73] Assignee: SGS-Thomson Microelectronics, S.R.L., Agrate Brianza, Italy

[21] Appl. No.: 810,480

[22] Filed: Dec. 19, 1991

[30] Foreign Application Priority Data

Dec. 28, 1990 [IT] Italy ................................ 22568 A/90

[51] Int. Cl.⁵ .................................................. G11C 7/02
[52] U.S. Cl. ...................................... 365/210; 365/203
[58] Field of Search .................... 365/210, 189.09, 203, 365/208

[56] References Cited

U.S. PATENT DOCUMENTS

| | | | |
|---|---|---|---|
| 4,884,241 | 11/1989 | Tanaka | 365/210 |
| 4,947,376 | 8/1990 | Arimoto | 365/203 |
| 5,010,518 | 4/1991 | Toda | 365/210 |
| 5,062,079 | 10/1991 | Tsuchida | 365/210 |

FOREIGN PATENT DOCUMENTS 0109184  7/1982  Japan ................................ 365/210

Primary Examiner—Eugene R. LaRoche
Assistant Examiner—A. Zarahian

[57] ABSTRACT

A memory cell reading circuit has a reference cell bit line and a matrix cell bit line connected to a supply voltage through respective loads and are furthermore connected by normally-off equalization transistors which are enabled by a first clock signal. The bit lines are further connected by normally-off resistive equalization transistors whose resistance is significant in conducting conditions. The equalization transistors are enabled by a first clock signal and the resistive equalization transistors are enabled by a second clock signal which has a duration that extends longer than the first clock signal. The memory cell reading circuit decreases the "read" time required for a memory cell, such as an EPROM cell, as compared to reading circuits previously used.

20 Claims, 3 Drawing Sheets

READING OF "1"
Vd−Vdn=1/3 RICELL

READING OF "0"
Vdn−Vd=(1−2K)/3 RICELL

MEMORY CELL READING CIRCUIT

TECHNICAL FIELD OF THE INVENTION

The present invention relates to a circuit, suitable for being implemented in an integrated circuit in CMOS technology, for reading cells, for example, in EPROM devices.

BACKGROUND OF THE INVENTION

The latest generations of EPROM memory devices show an improvement in various device parameters included in specifications by manufacturers. The transistor density of the devices and their speed have increased, while power consumption both during the active phase and during the standby phase has decreased. However, some of these parameters conflict with one another. In particular, speed is negatively affected by increased transistor density. That is, increased transistor density entails larger resistors and capacitors distributed among the rows and columns of the cell matrix of the device, which in turn increases the RC time constants. Increased RC time constants result in slower device speeds. Thus, a device may have increased transistor density, but at the price of slower device speeds.

There are two particular factors which limit the speed of the device: one, the delay related to the RC time constant of the row in the cell matrix (resistance R of the polysilicon conductor, capacitance C of the gates of the cells connected in parallel to the row); and, two, the delay related to the capacitance of the column in the cell matrix (i.e., of the drain junctions of the connected cells). The delay resulting from the row time constant RC can be decreased through technological solutions which reduce the resistivity of the conductor. The delay due to the capacitance of the column of cells in the matrix, however, has yet to be coped with satisfactorily.

SUMMARY OF THE INVENTION

The object of the invention is to provide a cell reading circuit, such as for an EPROM, of the unbalanced-load type which reads the contents of the cells in the matrix faster, particularly in the case of high-density EPROM devices. Another object of the invention is to provide a reading circuit possessing a read amplifier with increased noise immunity.

The invention achieves this aim, these objects and others which will become apparent hereinafter, by means of a cell reading circuit of the unbalanced-load type. The reading circuit includes a reference cell bit line and a matrix cell bit line connected to a supply voltage through respective loads and are furthermore connected by normal-off equalization transistors which are enabled by a first clock signal. The bit lines are still further connected by normally-off resistive equalization transistors which have a resistance that is significant in conducting conditions. The resistive equalization transistors are enabled by a second clock signal which lasts significantly longer than the first clock signal.

A sense amplifier connected to the reference cell and matrix cell bit lines detects a voltage differential produced as a result of current flow through the resistive equalization transistor.

BRIEF DESCRIPTION OF THE DRAWINGS

The invention is now described in greater detail with reference to some preferred embodiments thereof, illustrated in the accompanying drawings which are given by way of nonlimitative example and wherein.

DETAILED DESCRIPTION

Figure 1:
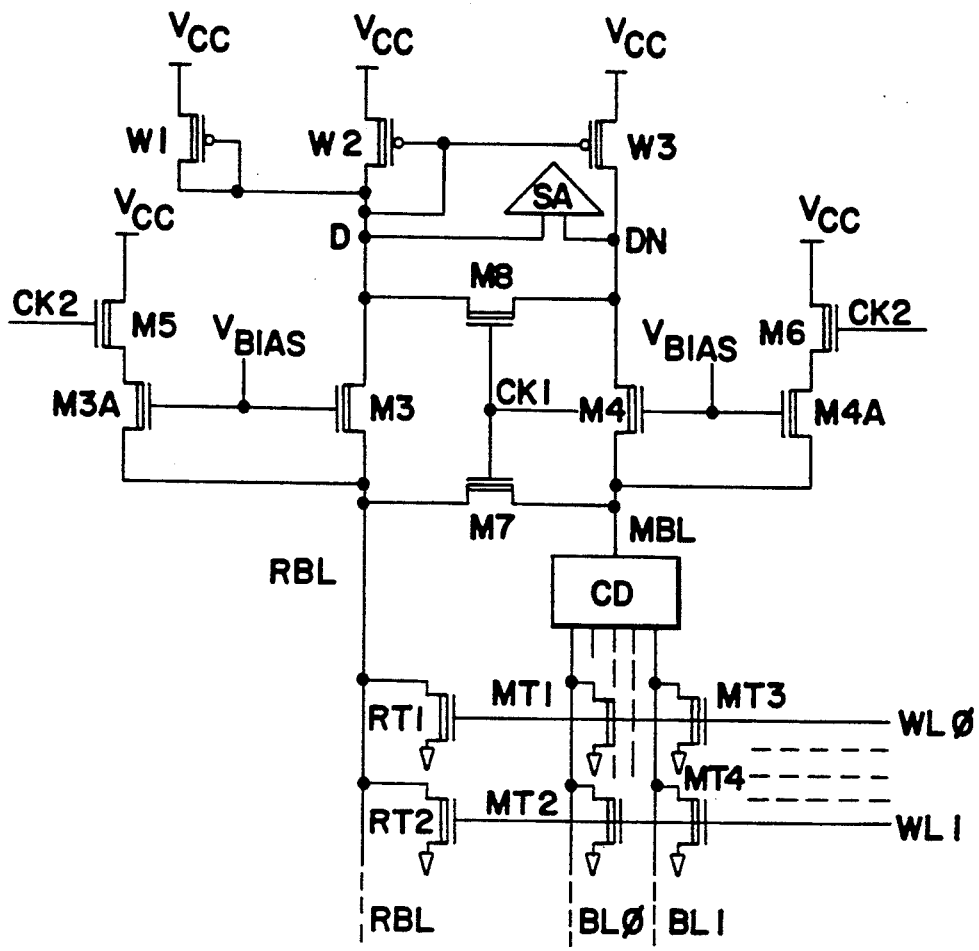
FIG. 1 is a simplified circuit diagram of an EPROM cell reading circuit according to the prior art.

A known circuit arrangement of an EPROM device, which aims to increase the speed of the various read steps, is shown in FIG. 1. Nonprogrammed reference cells, such as RT1 and RT2, are selected by means of word lines (or rows) such as WL$\emptyset$ and WL1, and their drains are connected in parallel to a reference bit line RBL. Reference bit line RBL is connected to the power supply $V_{cc}$ through a cell drain limiting transistor M3 and a load circuit. The load circuit is composed of two P-channel transistors W1 and W2 which are connected in parallel and are diode-connected.

The transistor M3 is biased by a fixed voltage $V_{BIAS}$. $V_{BIAS}$ also biases a second transistor M3A. Transistor M3A is connected to the power supply $V_{cc}$ through a transistor M5 whose gate is controlled by a phase CK2 of the clock. The node D between the line and the load is the read node for one of the inputs to a differential read sense amplifier, which is not shown.

Matrix cells such as MT1, MT2, MT3 and MT4 are selected by means of word lines (or rows) such as WL$\emptyset$, WL1 and bit lines (or columns) such as BL$\emptyset$ and BL1. BL$\emptyset$ and BL1 are decoded in a column decoder CD. A single matrix line MBL exits column decoder CD. Matrix line MBL is connected to the power supply $V_{cc}$ through a cell drain limiting transistor M4 and a load. The load for bit line MBL is constituted by a P-channel transistor W3.

P-channel transistor W3 is current-mirror connected to the transistors W1 and W2. The current ratio of 2 to 1 occurs between the reference bit line RBL and the matrix bit line MBL in this current mirror.

Transistors M4 and M4A are biased by a fixed bias voltage $V_{BIAS}$. Transistor M4A is connected to the power supply $V_{cc}$ through a transistor M6. The gate of transistor M6 is controlled by the phase CK2 of the clock. The sensing node DN between the line and the load is the second input or read node for the sense amplifier, not shown in FIG. 1.

The reference bit line RBL and the matrix bit line MBL are connected by two equalization transistors M7 and M8 which are enabled by a phase CK1 of the clock.

In the above described circuit, the transistors M3 and M4 introduce a capacitive decoupling which limits the cell drain voltage. Transistors M3 and M4 also perform a cascade amplifier function between the capacitance of the bit lines and the capacitance of the read nodes D and DN, respectively.

The load transistors W1, W2 and W3 are sized according to the current in the cell so as to generate a level at the read (or sense) nodes D, DN which is sufficient for a good biasing of the differential amplifier (not illustrated) to which they are connected. Load transistors W1, W2, and W3 are therefore insufficient to rapidly charge the bit lines to the read value.

The clock signal CK2 thus determines a preloading step during which additional transistors M5 and M6, termed preloading transistors, are inserted. Said preloading transistors M5 and M6 inject an additional current immediately after selection.

The reference bit line and the matrix bit line are equalized during the clock phase CK1 by the transistors M7 and M8. Transistors M7 and M8 avoid the delay due to the crossing of the read nodes which are otherwise driven by the current of the cells during the read step.

Figure 2:
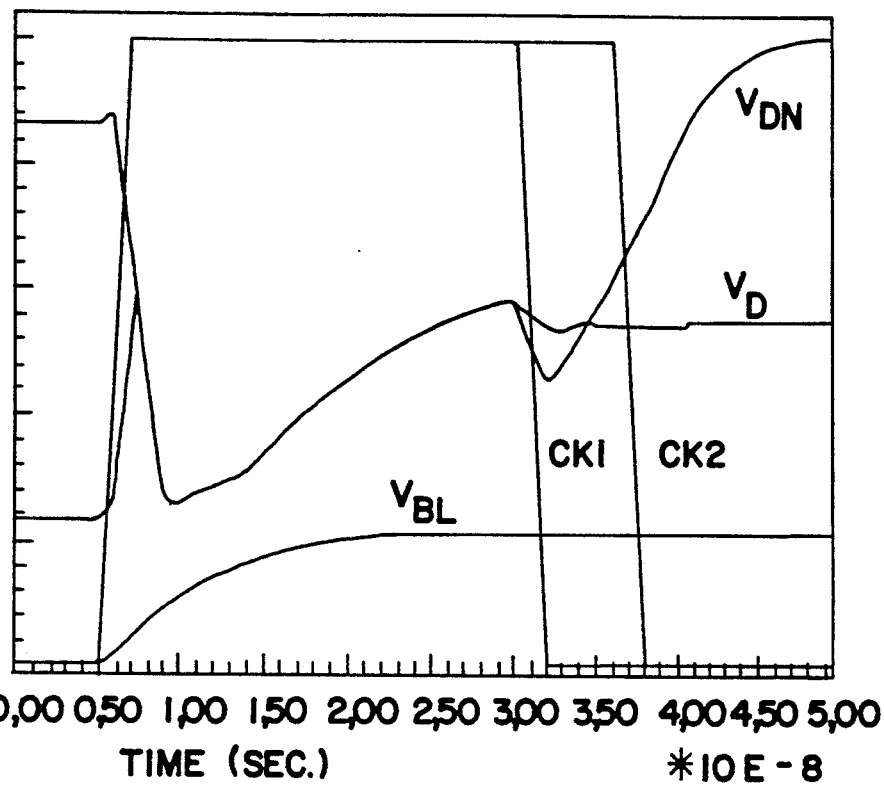
FIG. 2 is a plot of some significant signals of the circuit of FIG. 1.

The plot of FIG. 2 shows a typical timing of the circuit of FIG. 1. The voltage $V_{BL}$ of the bit line rises asymptotically toward its final value, whereas the voltages $V_D$ and $V_{DN}$ on the two read nodes are equalized during the clock phase and then assume their final values. The delay between the descending edges of the two clock phases CK1 and CK2 must account for the read or sensing time and the time for transferring the data to the outputs.

The circuit arrangement of FIG. 1 has several limitations. The first limitation relates to the preloading time. $V_{BL}$ must have reached its asymptotic value when the clock phase ends. Otherwise, there is a settling transient which is driven by the difference current between the current in the load, $I_{load}$, and the current in the cell, $I_{cell}$. If the decoder CD and the bit line MBL are represented as a set of resistors and capacitors RC, the width of the clock phase cannot be smaller than approximately 8 times RC in order to avoid incomplete preloading.

The second limitation with the illustrated prior art circuit relates to noise. The sense nodes D and DN are designed to have the smallest possible capacitance due to the low current level which drives them. The low capacitance of the sense nodes leads to an unavoidable compromise on the equalization transistors M7 and M8. Good equalization in this circuit requires that transistors M7 and M8 be large but this leads to high capacitance. Large capacitance on transistors M7 and M8 creates a high capacitive coupling, and accordingly, an increase in the duration of the read step, i.e., in the delay between CK1 and CK2. Thus, in order to avoid the potential for noise interfering with the accuracy of the sense amplifier in this configuration, a longer read time duration is required.

Figure 3:
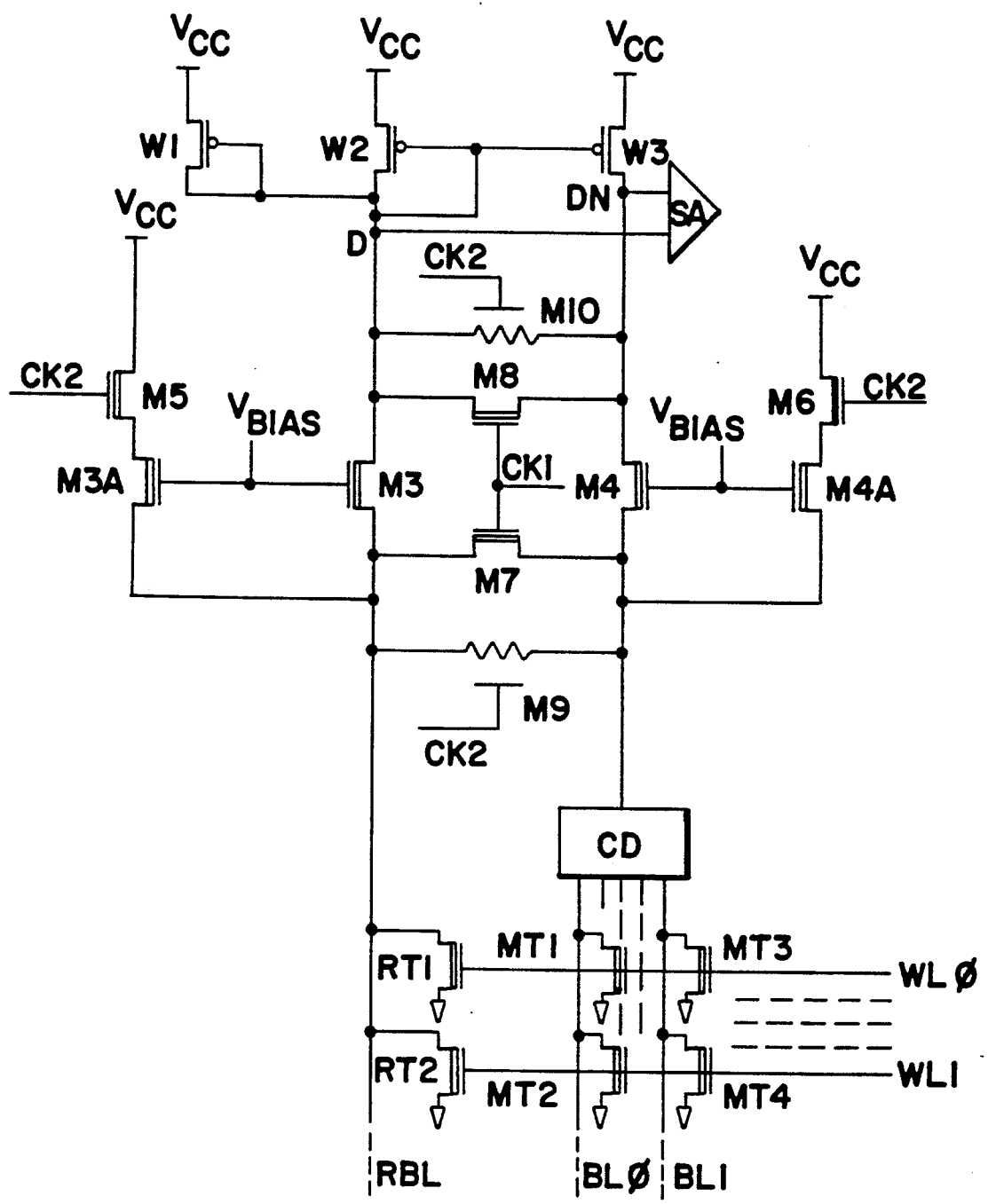
FIG. 3 is a simplified circuit diagram of an EPROM cell reading circuit according to the teachings of the invention.

The above limitations are overcome by the circuit arrangement of FIG. 3, which again comprises all the elements as that of FIG. 1. This circuit, however, also has two resistive equalization transistors M9 and M10 which are arranged in parallel to the transistors M7 and M8. Resistive equalization transistors M9 and M10 are controlled by the clock signal CK2. Transistors M7 and M8 are controlled by clock signal CK1.

Figure 4:
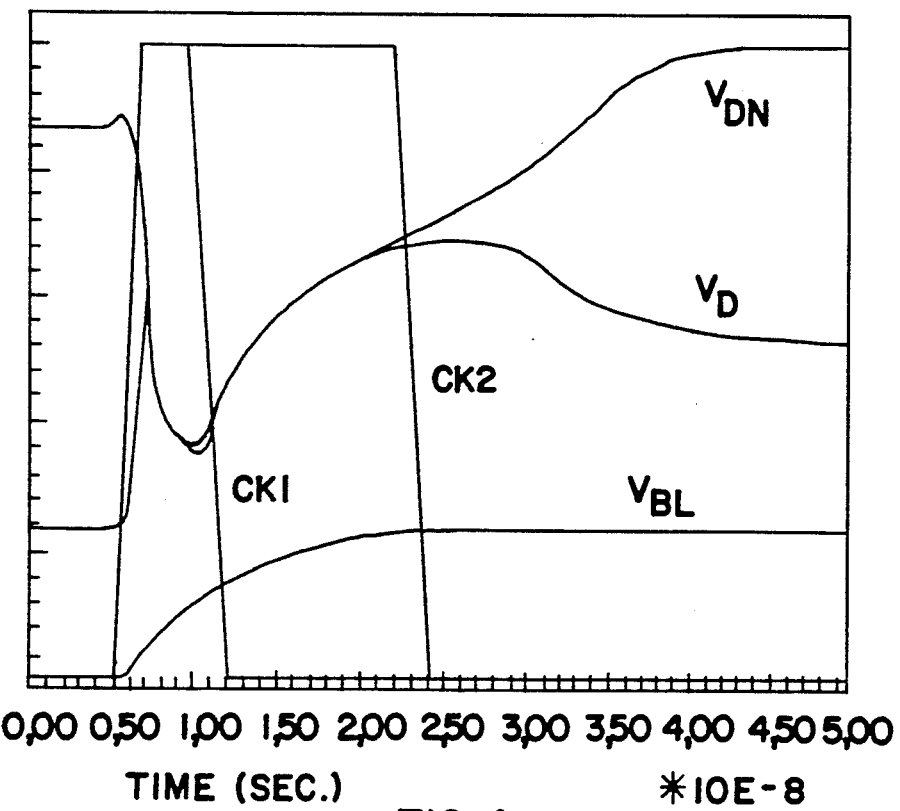
FIG. 4 is a plot of some significant signals of the circuit of FIG. 3.

Resistive equalization transistors M9 and M10 are manufactured with a very small ratio between channel width and length so that they have a significant resistance (of the order of a few kohm, for example approximately 2 kohm) when they are in the conducting state. The transistors M9 and M10 are enabled simultaneously with the transistors M7 and M8, but remain on for a significantly longer time with respect thereto, as shown in the plot of FIG. 4.

The time CK1 can furthermore thus be reduced significantly with respect to what is possible with the circuit of the prior art due to the presence of resistive transistors M9 and M10. Reading can begin before $V_{BL}$ has asymptotically reached its final value. Thus, the overall cell reading process is faster.

Figure 5:
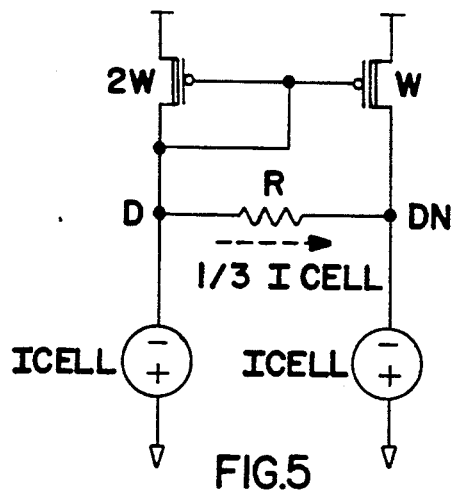
FIG. 5 is an electric diagram, equivalent to the circuit of FIG. 3, in the case of nonprogrammed cell reading.

FIG. 5 is a partial equivalent electrical diagram for the reading of a nonprogrammed cell, where R is the resistance for each of the secondary equalization transistors M9 and M10. In this case, the matrix current ($I_{mat}$) and the reference current ($I_{ref}$) are equal to the current $I_{cell}$ in the nonprogrammed cell, and the total current is $2I_{cell}$. Since the ratio between the loads is 2, the current supplied by the load of the reference bit line is $(4/3)I_{cell}$, whereas the current supplied by the load of the matrix bit line is $(2/3)I_{cell}$. A current $I_R$ equal to $(1/3)I_{cell}$ must flow in the resistive path between the read nodes D and DN. The difference between the voltages $V_D$ and $V_{DN}$ on the two read nodes is thus:

$$V_D - V_{DN} = (\tfrac{1}{3}) * R * I_{cell} \tag{1}$$

Figure 6:
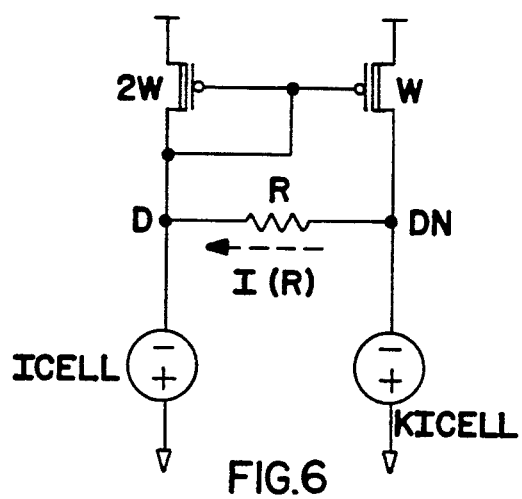
FIG. 6 is a partial electric diagram, equivalent to the circuit of FIG. 3, in the case of written cell reading.

FIG. 6 is similar to FIG. 5, but refers to the reading of a written cell. In this case, the matrix current ($I_{mat}$) is equal to $K*I_{cell}$, where K (smaller than ½) is the ratio between the matrix current and the reference current. As is known to those skilled in the art, the current $I_v$ of the nonprogrammed cell and the current $I_s$ of the written cell can be expressed as:

$$I_v = B(V_{cc} - V_{min})$$

$$I_s = B(V_{cc} - \delta V_{th} - V_{min})$$

where B is the current gain of the cell, $\delta V_{th}$ is the threshold change performed by the written cell, and $V_{min} = V_{th} + 0.5$ V. The ratio K is then $$K = I_s/I_v = 1 - \delta V_{th}/(V_{cc} - V_{min}) \tag{2}$$

Relation (2) shows that K increases with $V_{cc}$. Naturally, given a threshold change $\delta V_{th}$, values of $V_{cc}$ for which $K \geq 0.5$ are not considered, since the write condition would no longer be verified.

The current which flows in R is thus:

$$I_R = (1 - 2K)(\tfrac{1}{3})I_{cell}.$$

By replacing from (2), one obtains:

$$I_R = B/3(2\delta V_{th} - (V_{cc} - V_{min})).$$

By again replacing the limit values for K (0 and ½), one obtains respectively:

For $K=0$: $\delta V_{th} = V_{cc} - V_{min}$; $I_R = (\tfrac{1}{3})I_{cell}$

For $K=\tfrac{1}{2}$: $\delta V_{th} = \tfrac{1}{2}(V_{cc} - V_{min})$; $I_R = 0$.

To conclude, when K Varies between 0 and 0.5, $I_R$ varies between $(\tfrac{1}{3})I_{cell}$ and 0, and therefore the difference voltage between the nodes also varies between 0 and $(\tfrac{1}{3})*R*I_{cell}$.

Figure 7:
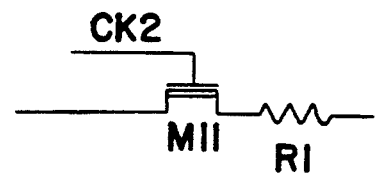
FIG. 7 is a partial electric diagram of a resistive element comprising a transistor in series with a resistor.

A preferred embodiment of the invention has been described, but it is understood that those skilled in the art can devise other equivalent variations and modifications. For example, although the transistors M9 and M10 have been described as being sized with a low aspect ratio in order to obtain a high conduction resistance, it is evident that the same result might be obtained with resistors arranged in series (as shown in FIG. 7 where the series combination of transistor M11 and resistor R1 can be substituted in place of either M9 or M10), or with an appropriate driving of said transistors so as to make them operate far from the saturation area, and thus in an area of significant resistance.

I claim:

1. An EPROM cell reading circuit of the unbalanced-load type having a reference cell bit line and a matrix cell bit line connected to a supply voltage through respective loads and each bit line further connected to a respective input of a sense amplifier, the cell reading circuit including:
  normally off equalization transistors connected between said bit lines and enabled by a first clock signal, and
  normally off resistive transistors connected between said bit lines and enabled by a second clock signal which lasts longer than said first clock signal, said resistive transistors having significant resistance when enabled in a conducting condition.

2. An EPROM cell reading circuit according to claim 1 wherein said second clock signal starts substantially with said first clock signal.

3. An EPROM cell reading circuit according to claim 1 wherein said resistive transistors are sized with a small ratio between channel width and length thereof so as to give rise to a relatively high resistance in the conducting state.

4. An EPROM cell reading circuit according to claim 1 wherein therein is included a resistor connected in series respectively with each of said resistive transistors.

5. An EPROM cell reading circuit according to claim 1 wherein the resistance of said resistive transistors is obtained by applying a gate voltage which will keep said transistors far from saturation in the on-state.

6. An EPROM cell reading circuit according to claim 1 wherein the resistance of said resistive transistors in the conducting state is greater than 1 kohm.

7. An EPROM cell reading circuit according to claim 1 wherein the resistance of said resistive transistors in the conducting state is approximately 2 kohm.

8. A memory cell reading circuit of the unbalanced-load type having a reference cell bit line and a matrix cell bit line connected respectively to inputs of a sense amplifier, the memory cell reading circuit including:
  an equalization transistor connected between said reference cell bit line and said matrix cell bit line for connecting said bit lines together when a first clock signal is applied to a control terminal of said equalization transistor, and
  a selectable resistive element connected between said reference cell bit line and said matrix cell bit line for providing a resistive connection between said reference cell bit line and said matrix cell bit line when a second clock signal is applied to a control terminal of said resistive element and wherein said second clock signal lasts longer than said first clock signal.

9. A memory cell reading circuit according to claim 8 wherein said selectable resistive element is a resistive transistor sized with a small ratio between channel width and length so as to give rise to relatively high resistance when in a conducting state, said resistive transistor having a control terminal thereof connected to receive said second clock signal.

10. A memory cell reading circuit according to claim 8 wherein said selectable resistive element comprises a transistor connected in series with a resistor and having a control terminal of the transistor connected to receive said second clock signal.

11. A memory cell reading circuit according to claim 8 wherein said selectable resistive element comprises a transistor which is operated far from saturation when said transistor is in a conducting state.

12. A memory cell reading circuit according to claim 8 wherein said selectable resistive element has a resistance greater than 1 kohm when said resistive element is in a conducting state.

13. A memory cell reading circuit according to claim 8 wherein said selectable resistive element has a resistance of approximately 2 kohm when said resistive element is in a conducting state.

14. A memory cell reading circuit according to claim 8 wherein said matrix cell bit line is connected to a matrix of EPROM cells.

15. A memory cell reading circuit according to claim 8 including:
  a respective load element connected serially in each of said bit lines,
  a second equalization transistor connected between said reference cell bit line and said matrix cell bit line on the opposite side of said load element from said first equalization transistor, said second equalization transistor having a control terminal thereof connected to receive said first clock signal, and
  a second selectable resistive element connected in parallel with said second equalization transistor for providing a resistive connection between said reference cell bit line and said matrix cell bit line when said second clock signal is applied to a control terminal of said second resistive element.

16. A method for reading a memory cell in which a reference cell bit line and a matrix cell bit line are connected respectively to inputs of a sense amplifier and said bit lines have an unbalanced load, comprising the steps of:
  connecting a matrix storage memory cell to said matrix cell bit line and connecting a reference cell to said reference cell bit line in response to a selection signal,
  activating an equalization transistor in response to a first clock signal to connect said reference cell bit line to said matrix cell bit line,
  connecting a resistive element between said reference cell bit line and said matrix cell bit line in response to a second clock signal which has a duration later than that of said first clock signal, and
  determining the state of said memory cell by detecting a signal difference between said reference cell bit line and said matrix cell bit line by operation of said sense amplifier after said resistive element has been connected between said reference cell bit line and said matrix cell bit line.

17. A method for reading a memory cell as recited in claim 16 wherein said second clock signal starts substantially simultaneously with said first clock signal.

18. A method for reading a memory cell as recited in claim 16 wherein said step of connecting a resistive element comprises activating a resistive transistor connected between said reference cell bit line and said matrix cell bit line.

19. A method for reading a memory cell as recited in claim 16 wherein said step of connecting a resistive element comprises activating a transistor having a series connected resistor wherein said transistor and said resistor are connected in series between said reference cell bit line and said matrix cell bit line.

20. A method for reading a memory cell as recited in claim 16 wherein said step of determining the state of said memory cell comprises reading the state of an EPROM cell.

* * * * *